US011569655B2

(12) United States Patent
Lin et al.

(10) Patent No.: US 11,569,655 B2
(45) Date of Patent: Jan. 31, 2023

(54) POWER DELIVERY SYSTEM AND RELATED METHOD OF DETECTING OVERCURRENT AND FAILURE

(71) Applicant: WELTREND SEMICONDUCTOR INC., Hsinchu (TW)

(72) Inventors: Cheng-Liang Lin, Hsinchu (TW); Jeng-Cheng Liu, Hsinchu (TW)

(73) Assignee: WELTREND SEMICONDUCTOR INC., Hsinchu (TW)

( * ) Notice: Subject to any disclaimer, the term of this patent is extended or adjusted under 35 U.S.C. 154(b) by 0 days.

(21) Appl. No.: 17/463,482

(22) Filed: Aug. 31, 2021

(65) Prior Publication Data
US 2022/0385059 A1 Dec. 1, 2022

(30) Foreign Application Priority Data
Jun. 1, 2021 (TW) .................................. 110119780

(51) Int. Cl.
*H02H 7/22* (2006.01)
*G01R 19/165* (2006.01)
*H02H 1/00* (2006.01)

(52) U.S. Cl.
CPC ......... *H02H 7/22* (2013.01); *G01R 19/16571* (2013.01); *G01R 19/16576* (2013.01); *H02H 1/0007* (2013.01)

(58) Field of Classification Search
CPC .. H02H 1/0007; H02H 7/22; G01R 19/16571; G01R 19/16576
USPC ........................................................ 361/93.1
See application file for complete search history.

(56) References Cited

U.S. PATENT DOCUMENTS

| 2016/0033566 | A1* | 2/2016 | Shiu ....................... H02H 3/087 361/87 |
| 2018/0183340 | A1* | 6/2018 | Waters .............. H02J 13/00016 |
| 2019/0278731 | A1* | 9/2019 | Mattos .................... G06F 1/266 |
| 2021/0058000 | A1* | 2/2021 | Ahmed ............. H02M 3/33592 |

FOREIGN PATENT DOCUMENTS

| CN | 109891824 A | 6/2019 |
| TW | M570555 U | 11/2018 |
| TW | 201939299 A | 10/2019 |
| WO | 2021/034861 A1 | 2/2021 |

* cited by examiner

*Primary Examiner* — Kevin J Comber
(74) *Attorney, Agent, or Firm* — Winston Hsu (57) ABSTRACT

A power delivery system includes a power sourcing equipment, a powered device and a transmission cable. When the power sourcing equipment is electrically connected to the powered device via the transmission cable, an over-current detecting circuit in the power sourcing equipment is configured to detect over-current occurrence of the powered device. Meanwhile, the power sourcing equipment is configured to determine the functionality of the over-current detecting circuit based on its specific pin and provide single fault protection when the over-current detecting circuit fails.

15 Claims, 8 Drawing Sheets

POWER DELIVERY SYSTEM AND RELATED METHOD OF DETECTING OVERCURRENT AND FAILURE

CROSS REFERENCE TO RELATED APPLICATION

This application claims priority of Taiwan Application No. 110119780 filed on 2021 Jun. 1.

BACKGROUND OF THE INVENTION

1. Field of the Invention

The present invention is related to a power delivery system and related method, and more particularly, to a power delivery system and related method of detecting overcurrent and failure.

2. Description of the Prior Art

A power supply is an electrical device that supplies electric power to an electrical load. A prior art power supply usually adopts an over-current detection and protection circuit to ensure safe operation. When detecting that the load current exceeds the maximum operation ratings of the power supply, the over-current detection and protection circuit may output an over-current protection signal to trigger a corresponding safety precaution measure (such as shutting down the power supply), thereby preventing sudden inrush current from damaging the devices in the power supply or the load. However, if the over-current detection and protection circuit somehow malfunctions, it may be able to monitor the load current and thus fail to provide over-current protection. Therefore, there is a need for a power delivery system and related method of detecting overcurrent and failure.

SUMMARY OF THE INVENTION

The present invention provides a power delivery system which detects over-current and failure. The power delivery system includes a powered device, a transmission cable, and a power sourcing equipment. The power sourcing equipment includes a first pin, a second pin, a third pin, a switching device, an attach/detach identification circuit, a voltage acquisition circuit, a current detecting circuit, a current and failure determination circuit, and a control circuit. The power conversion circuit is configured to supply power to the powered device via the second pin. The switching device is configured to selectively conduct or cut off a power supply path between the power conversion circuit and the second pin. The attach/detach identification circuit is configured to determine whether the power sourcing equipment is electrically connected to the powered device via the transmission cable and output a corresponding first signal. The voltage acquisition circuit is configured to record an initial voltage of the third pin during a first period when the power sourcing equipment is electrically connected to the powered device but does not supply power to the powered device, and record a current voltage of the third pin during a second period when the power sourcing equipment is supplying power to the powered device via the second pin. The current detecting circuit is configured to monitor a value of a load current during the second period. The current and failure determination circuit is configured to determine whether the current voltage is larger than the initial voltage by a voltage threshold during the second period and output a corresponding second signal, and determine whether the load current is smaller than a current threshold during the second period and output a corresponding third signal. The control circuit is coupled to the attach/detach identification circuit and the current and failure determination circuit for receiving the first signal, the second signal and the third signal, and configured to deactivate the switching device for cutting off the power supply path between the power conversion circuit and the second pin when determining that the current voltage is larger than the initial voltage by the voltage threshold according to the second signal and when determining that the load current is smaller than the current threshold according to the third signal.

The present invention also provides a method of detecting over-current and failure in a power delivery system. The method includes determining whether a power sourcing equipment in the power delivery system is electrically connected to a powered device in the power delivery system, recording an initial voltage of a first pin in the power delivery system during a first period when the power sourcing equipment is electrically connected to the powered device but does not supply power to the powered device, recording a current voltage of the first pin and monitoring a load current during a second period when the power sourcing equipment is supplying power to the powered device via a second pin, and the power sourcing equipment performing a single-fault protection procedure for stopping supplying power to the powered device when determining that the load current is smaller than a current threshold and that the current voltage is larger than the initial voltage by a voltage threshold.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
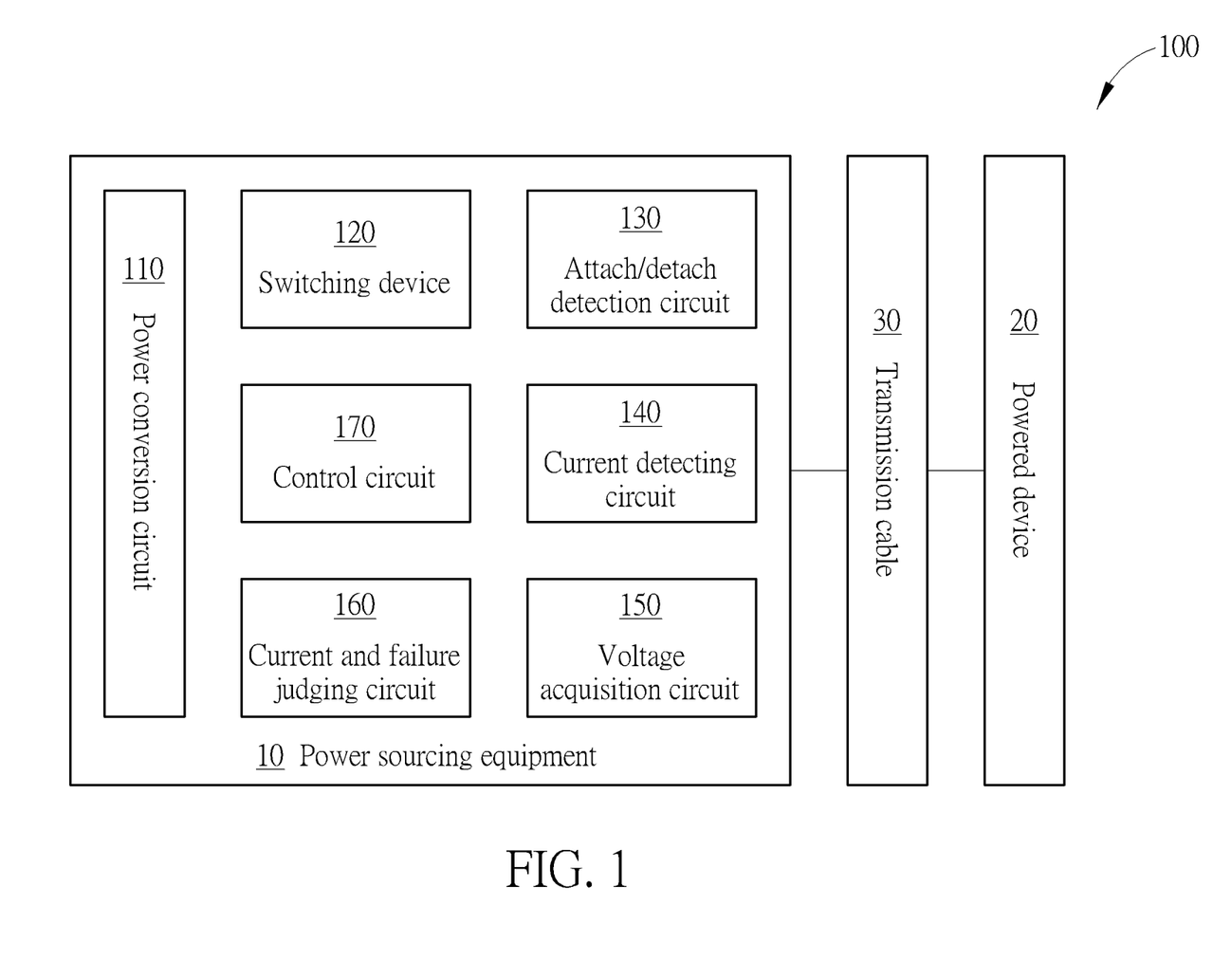
FIG. 1 is a functional diagram illustrating a power delivery system according to an embodiment of the present invention.

FIG. 1 is a functional diagram illustrating a power delivery (PD) system 100 according to an embodiment of the present invention. The power delivery system 100 includes power sourcing equipment 10, a powered device 20, and a transmission cable 30. The power sourcing equipment 10 includes a power conversion circuit 110, a switching device 120, a attach/detach identification circuit 130, a current detecting circuit 140, a voltage acquisition circuit 150, a current and failure judging circuit 160, and a control circuit 170. The power sourcing equipment 10 may be electrically connected to the powered device 20 via the transmission cable 30 and supply power to the powered device 20.

Figure 2A:
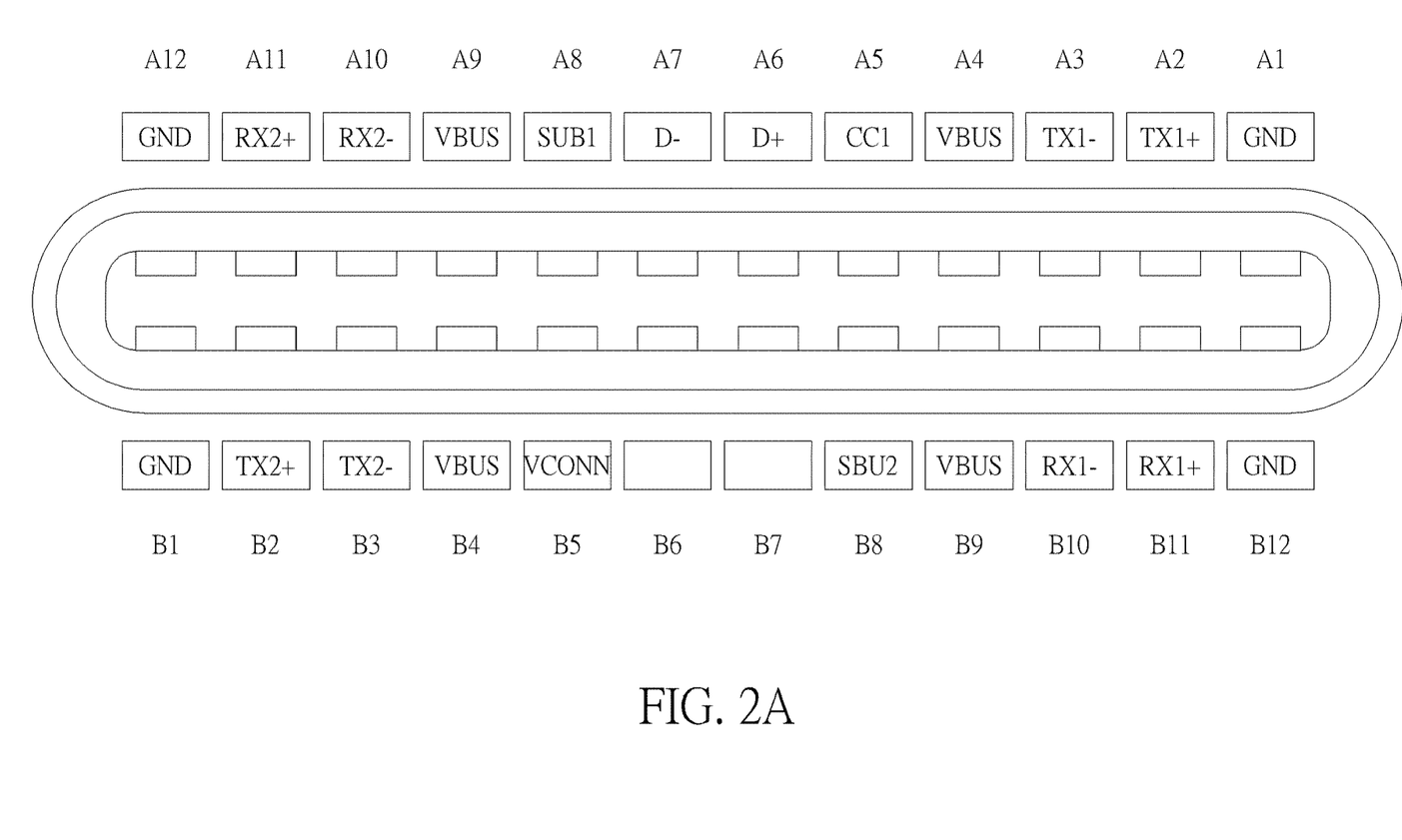
FIG. 2A is a diagram illustrating the pin configuration of a USB Type-C female connector.
Figure 2B:
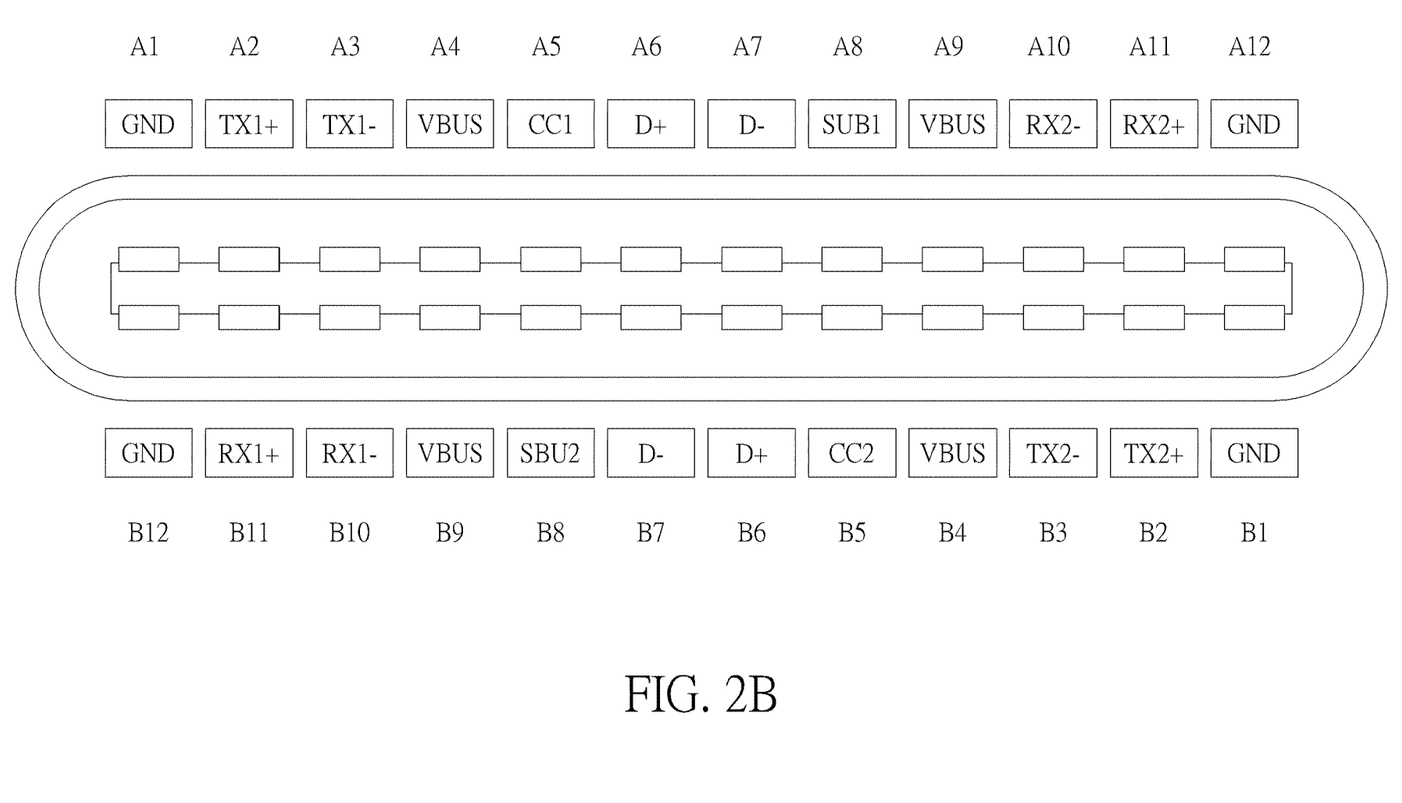
FIG. 2B is a diagram illustrating the pin configuration of a USB Type-C male connector.

In an embodiment of the present invention, the transmission cable 30 may adopt a transmission interface which complies with a Universal Serial Bus (USB) Type-C standard. FIGS. 2A and 2B are diagrams illustrating the specification of a transmission interface complying with the current USB Type-C standard, wherein FIG. 2A is a diagram illustrating the pin configuration of a USB Type-C female connector (socket) and FIG. 2B is a diagram illustrating the pin configuration of a USB Type-C male connector (plug). In order to support device insertion of any orientation, the USB Type-C male and female connectors each include a set of pins arranged in a symmetrical manner and designated by A1-A12 and B1-B12, respectively. The differential data bus pins TX1+/TX1−, TX2+/TX2−, RX1+/RX1−, and RX2+/RX2− pins are used for transmitting data signals. The power supply pin VBUS is used to supply main power. The voltage connect pin VCONN (only on USB Type-C male connector) is used for transmitting power signals. The configuration channel pins CC1/CC2 are used to determine port attach and detach, detect cable orientation, detect downstream facing port (DFP) and upstream facing port (UFP), configure VBUS/VCONN pins, alternate mode or accessory mode configuration, and perform PD related operations. The differential pins D+/D− are used to provide compatibility to USB 2.0 specification. The sideband use pins SBU1/SBU2 are used for transmitting control signals. The ground pin GND is biased at a ground voltage. The power sourcing equipment 10 is configured to supply power via its power supply pin VBUS after determining that a device has been attached based on the status of its configuration channel pins CC1/CC2.

FIGS. 3-6 are diagrams illustrating the implementation of the power delivery system 100 according to embodiments of the present invention. In the present invention, the power sourcing equipment 10 and the powered device 20 each include multiple pins which comply with a specific transmission standard (such as USB Type-C standard), and the transmission cable 30 includes a source terminal 31 and a sink terminal 32. According to the types of the power sourcing equipment 10 and the powered device 20, each of the source terminal 31 and the sink terminal 32 may be the USB Type-C female connecter depicted in FIG. 2A or the USB Type-C male connecter depicted in FIG. 2B. For simplicity and ease of explanation, FIGS. 3-6 only depict the configuration channel pins CC1/CC2, the power supply pin/cable VBUS, and the ground pin/cable GND, wherein $R_{GND}$ represents the internal impedance of the transmission cable 30.

In the power delivery system 100 depicted in FIGS. 3-6, the power conversion circuit 110 is configured to supply power to the load via the power supply pin VBUS. The control circuit 170 is configured to selectively turn on or turn off the switching circuit 120 according to signals S1-S3, thereby selectively conducting or cutting off the power supply path between the power conversion circuit 110 and the power supply pin VBUS. When the switching circuit 120 is turned off, the power sourcing equipment 10 is a non-power-supplying stat; when the switching circuit 120 is turned on, the power sourcing equipment 10 is a power-supplying state. In an embodiment, the switching circuit 120 may be a bipolar junction transistor (BJT), a field effect transistor (FET), or any device providing similar function. However, the type of the switching circuit 120 does not limit the scope of the present invention.

In the power delivery system 100 depicted in FIGS. 3-6, the attach/detach identification circuit 130 includes a pull-up resistor RP1, a pull-up resistor RP2, and an identification circuit 35. The configuration channel pin CC1 of the power sourcing equipment 10 is coupled to a positive bias voltage V+ via the pull-up resistor RP1, and the configuration channel pin CC2 of the power sourcing equipment 10 is coupled to the positive bias voltage V+ via the pull-up resistor RP2. At the same time, the configuration channel pin CC1 of the powered device 20 is coupled to the ground voltage GND via a pull-down resistor RD1, and the configuration channel pin CC2 of the powered device 20 is coupled to the ground voltage GND via the pull-down resistor RP2. The identification circuit 35 is configured to output the signal S1 associated with the attach/detach status according to the configuration channel pins CC1 and CC2 of the power sourcing equipment 10. In the embodiment illustrated in FIGS. 3 and 4, the identification circuit 35 includes a comparator CP1 having a positive input end coupled to the configuration channel pin CC1 or CC2 of the power sourcing equipment 10, a negative input end coupled to a reference voltage $V_{REF1}$, and an output end coupled to the control circuit 170.

In the power delivery system 100 depicted in FIGS. 3-6, the current detecting circuit 140 includes a detecting resistor Rs and an amplifying circuit 40, wherein Vs' represents the voltage established across the detecting resistor Rs, and Is represents the detecting current flowing through the detecting resistor Rs. The amplifying circuit 40 is configured to amplify the voltage Vs' established across the detecting resistor Rs, thereby providing a corresponding detecting voltage Vs. When the power sourcing equipment 10 is not electrically connected to the powered device 20, the value of the load current $I_{LOAD}$ is 0, and the values of the detecting current Is and the detecting voltage Vs are both 0. When the power sourcing equipment 10 is electrically connected to the powered device 20, the value of the voltage Vs' established across the detecting resistor Rs and the value of the detecting current Is are associated with the value of the load current $I_{LOAD}$. Under such circumstance, the amplifying circuit 40 is able to detect and amplify the voltage Vs' established across the detecting resistor Rs, thereby providing the detecting voltage Vs associated with the value of the load current $I_{LOAD}$.

Figure 3:
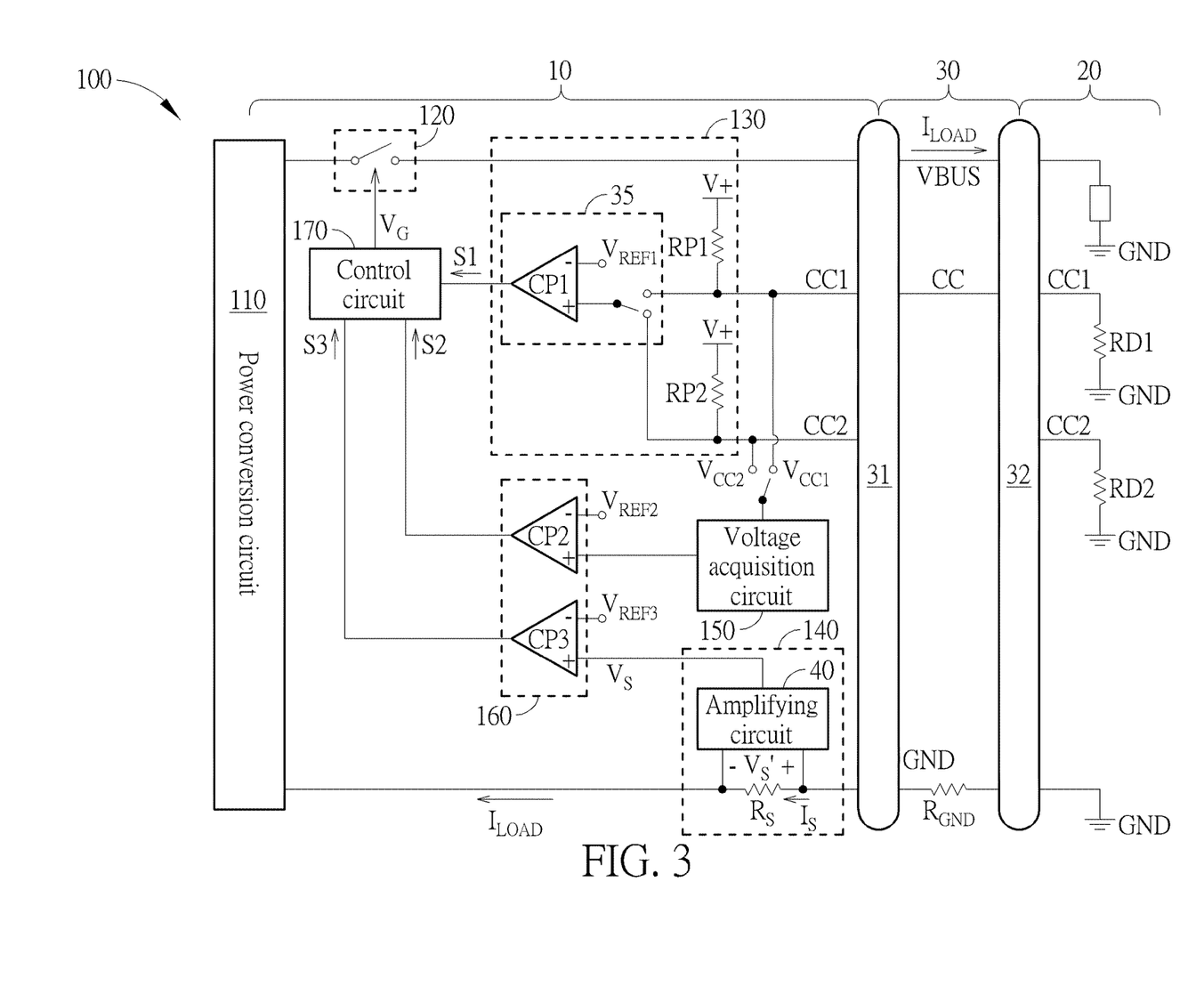
FIG. 3 is a diagram illustrating an implementation of the power delivery system according to an embodiment of the present invention.
Figure 4:
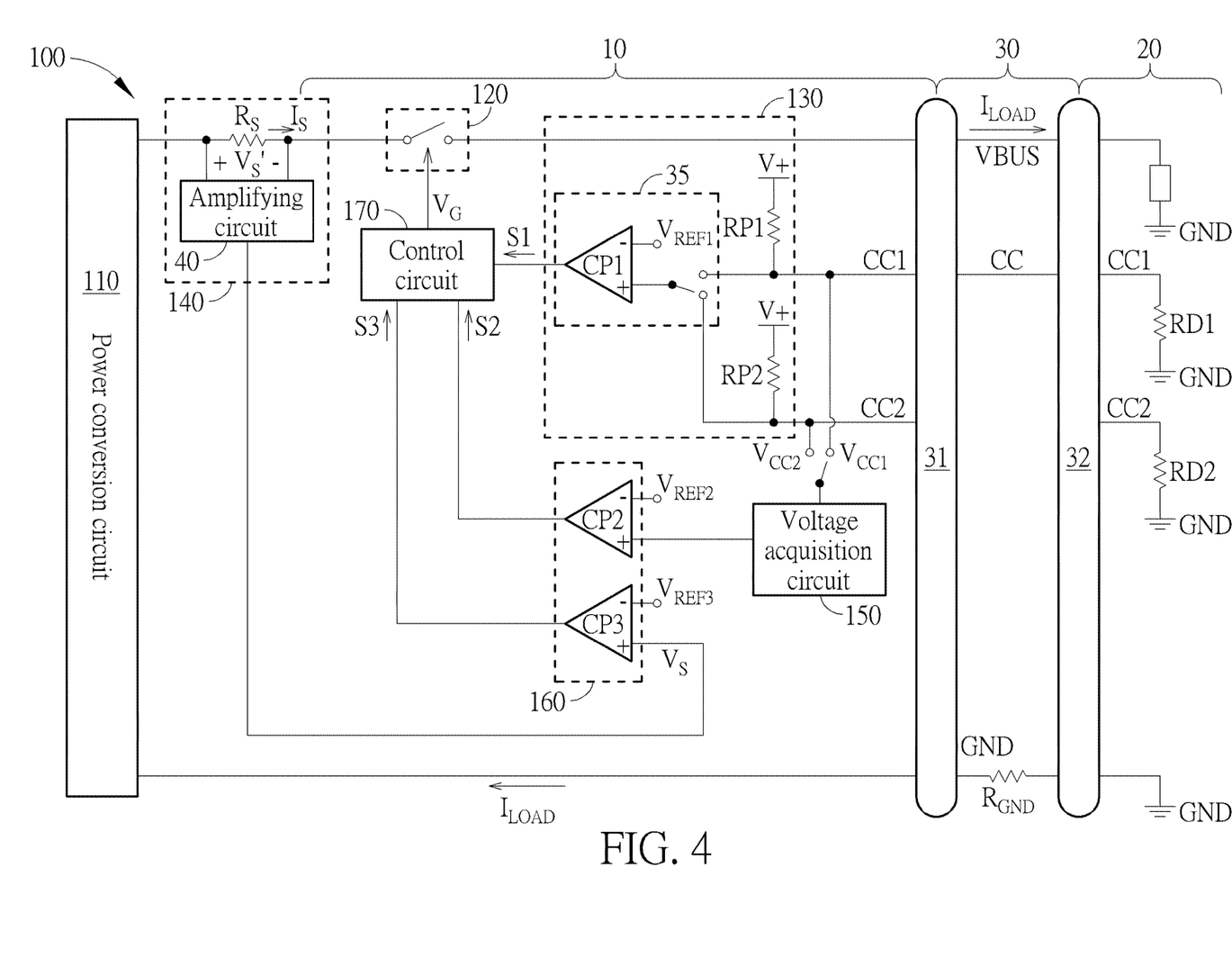
FIG. 4 is a diagram illustrating an implementation of the power delivery system according to another embodiment of the present invention.
Figure 5:
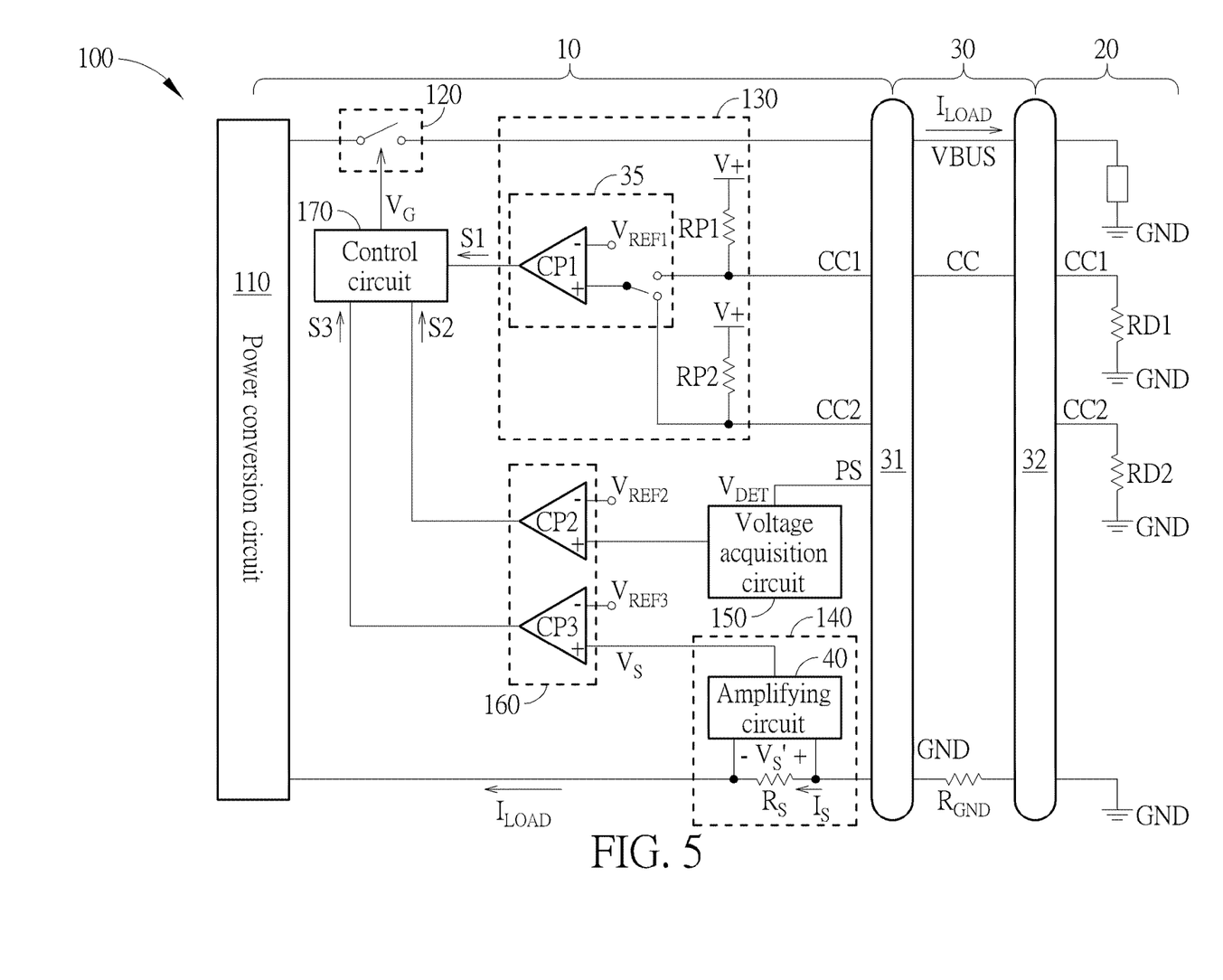
FIG. 5 is a diagram illustrating an implementation of the power delivery system according to another embodiment of the present invention.

In the embodiments depicted in FIGS. 3 and 5, the current detecting circuit 140 is coupled between the power conversion circuit 110 and the ground pin GND of the source terminal 31 for performing low-side current sensing. In the embodiments depicted in FIGS. 4 and 6, the current detecting circuit 140 is coupled between the power conversion circuit 110 and the switching circuit 120 for performing high-side current sensing. However, the implementation of the current detecting circuit 140 does not limit the scope of the present invention.

In the power delivery system 100 depicted in FIGS. 3 and 4, the voltage acquisition circuit 150 is configured to measure and store a voltage $V_{CC1}$ or $V_{CC2}$ on the configuration channel pin CC1 or CC2. In an embodiment, the voltage acquisition circuit 150 may include an analog-to-digital converter and a storage unit for recording the values of the voltage $V_{CC1}$ or $V_{CC2}$ at different time points and converting the voltage $V_{CC1}$ or $V_{CC2}$ into a digital signal. In another embodiment, the voltage acquisition circuit 150 may include a sample and hold circuit and a storage unit for recording the values of the voltage $V_{CC1}$ or $V_{CC2}$ at different time points. However, the implementation of the voltage acquisition circuit 150 does not limit the scope of the present invention.

Figure 6:
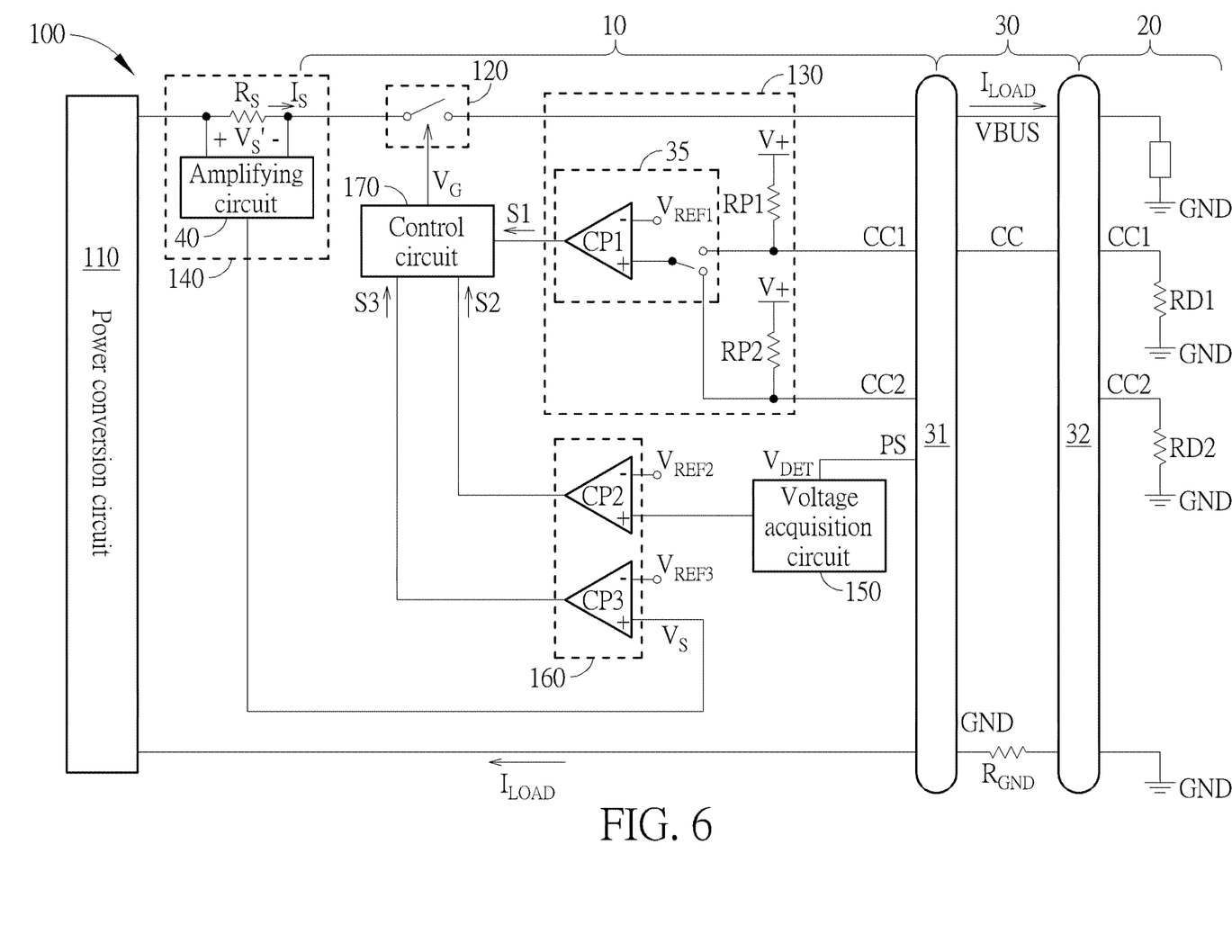
FIG. 6 is a diagram illustrating an implementation of the power delivery system according to another embodiment of the present invention.

In the power delivery system 100 depicted in FIGS. 5 and 6, the voltage acquisition circuit 150 is configured to measure and store a voltage $V_{DET}$ on a signal pin PS, which is used by the power sourcing equipment 10 to receive external signals. The above-mentioned signal pin PS may be the differential pin D+, the differential pin D−, the sideband use pin SBU1, or the sideband use pin SBU2, but is not limited thereto. In an embodiment, the voltage acquisition circuit 150 may include an analog-to-digital converter and a storage unit for recording the values of the voltage $V_{DET}$ at different time points and converting the voltage $V_{DET}$ into a digital signal. In another embodiment, the voltage acquisition circuit 150 may include a sample and hold circuit and a storage unit for recording the values of the voltage $V_{DET}$ at different time points. However, the implementation of the voltage acquisition circuit 150 does not limit the scope of the present invention.

In the power delivery system 100 depicted in FIGS. 3-6, the current and failure judging circuit 160 includes comparators CP2 and CP3. The comparator CP2 includes a positive input end coupled to the output end of the voltage acquisition circuit 150, a negative input end coupled to a reference voltage $V_{REF2}$, and an output end coupled to the control circuit 170. The comparator CP3 includes a positive input end coupled to the output end of the current detecting circuit 140, a negative input end coupled to a reference voltage $V_{REF3}$, and an output end coupled to the control circuit 170. Based on the relationship between the voltages $V_{CC1}/V_{CC2}/V_{DET}$ and the reference voltage $V_{REF2}$, the comparator CP2 is configured to output the corresponding signal S2 to the control circuit 170. Based on the relationship between the detecting voltage Vs provide by the current detecting circuit 140 and the reference voltage $V_{REF3}$, the comparator CP3 is configured to output the corresponding signal S3 to the control circuit 170.

Figure 7:
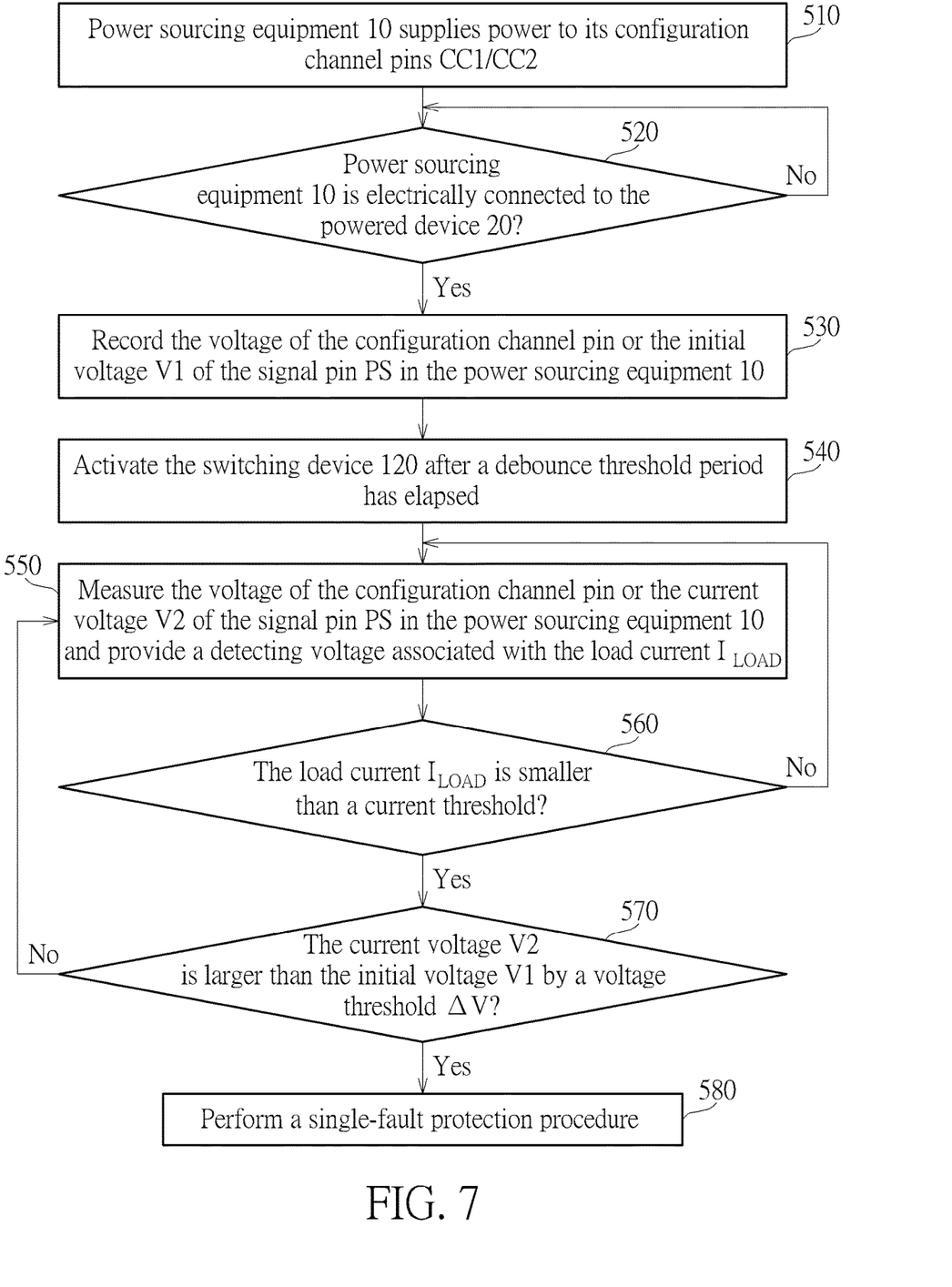
FIG. 7 is a flowchart illustrating the operation of the power delivery system according to an embodiment of the present invention.

In the power delivery system 100 depicted in FIGS. 3-6, the control circuit 170 is configured to control the operation of the power delivery system 100 based on the signals S1-S3. FIG. 7 is a flowchart illustrating the operation of the power delivery system 100 according to an embodiment of the present invention. Among the steps depicted in FIG. 7, steps 510-540 are performed in the non-power-supplying state (when the switching device 120 is turned off), and steps 540-580 are performed in the power-supplying state (when the switching device 120 is turned on).

Step 510: the power sourcing equipment 10 supplies power to its configuration channel pins CC1/CC2.

Step 520: determine whether the power sourcing equipment 10 is electrically connected to the powered device 20; if yes, execute 530; if no, execute step 520.

Step 530: record the initial voltage V1 of the configuration channel pin or the signal pin PS of the power sourcing equipment 10.

Step 540: turn on the switching device 120 after a debounce threshold period has elapsed.

Step 550: measure the current voltage V2 of the configuration channel pin or the signal pin PS of the power sourcing equipment 10 and monitor the value of the load current $I_{LOAD}$.

Step 560: determine whether the load current $I_{LOAD}$ is smaller than a current threshold; if yes, execute 570; if no, execute step 550.

Step 570: determine whether the current voltage V2 of the configuration channel pin or the signal pin PS of the power sourcing equipment 10 is larger than the initial voltage V1 by a voltage threshold ΔV; if yes, execute 580; if no, execute step 550.

Step 580: perform a single-fault protection procedure.

In step 510, the power sourcing equipment 10 is configured to supply power to its configuration channel pins CC1/CC2. In an embodiment, the power sourcing equipment 10 may supply power to its configuration channel pins CC1/CC2 via a voltage source and a resistor so as to bias its configuration channel pins CC1/CC2 to the positive bias voltage V+. In another embodiment, the power sourcing equipment 10 may supply power to its configuration channel pins CC1/CC2 via a current source so as to bias its configuration channel pins CC1/CC2 to the positive bias voltage V+. However, the method adopted by the power sourcing equipment 10 for supplying power to its configuration channel pins CC1/CC2 does not limit the scope of the present invention.

In step 520, the control circuit 170 is configured to determine whether the power sourcing equipment 10 is electrically connected to the powered device 20 based on the signal S1 provided by the attach/detach identification circuit 130. When no device is attached to the power sourcing equipment 10, its configuration channel pins CC1/CC2 are maintained at the positive bias voltage V+. When the power sourcing equipment 10 is electrically connected to the transmission cable 30 or to the powered device 20 via the transmission cable 30, its configuration channel pins CC1/CC2 can detect the resistor Ra and/or the pull-down resistors CC1/CC2. The following table 1 illustrates the attach/detach status of the power sourcing equipment 10 based on its configuration channel pins CC1/CC2.

TABLE 1

| CC1 | CC2 | attach/detach status |
|---|---|---|
| open circuit | open circuit | No device is attached |
| RD1/RD2 | open circuit | Connected to UFP device |
| open circuit | RD1/RD2 | |
| open circuit | Ra | Connected to transmission cable, but not connected to UFP device |
| Ra | open circuit | |
| RD1/RD2 | Ra | Connected to transmission cable and UFP device |
| Ra | RD1/RD2 | |

Since the transmission 30 only includes one CC line, the power sourcing equipment 10 is able to know which one of its configuration channel pins CC1/CC2 detects a resistor and determine its attach/detach status based on the voltage of its configuration channel pins CC1/CC2. When the power sourcing equipment 10 is attached to the powered device 20 in a first orientation, the configuration channel pin CC1 of the source terminal 31 is electrically connected to the configuration channel pin CC1 of the drain terminal 32, and the configuration channel pin CC2 of the source terminal 31 is electrically connected to the configuration channel pin CC2 of the drain terminal 32. When the power sourcing equipment 10 is attached to the powered device 20 in a second orientation, the configuration channel pin CC1 of the source terminal 31 is electrically connected to the configuration channel pin CC2 of the drain terminal 32, and the configuration channel pin CC2 of the source terminal 31 is electrically connected to the configuration channel pin CC1 of the drain terminal 32. For simplicity of explanation, the embodiment of attaching the power sourcing equipment 10 to the powered device 20 in the first orientation is used to explain the present invention.

After determining that the power sourcing equipment 10 is electrically connected to the powered device 20, the current and failure judging circuit 160 is configured to record the voltage $V_{CC1}$ of the configuration channel pin CC1 or the initial voltage V1 of the signal pin PS in the power sourcing equipment 10 in step 530.

In step 540, the control circuit 170 is configured to output the switch control signal $V_G$ after the debounce threshold period has elapsed, thereby turning on the switching device 120. The debounce threshold period is introduced to prevent misjudgment due to external interferences, and its value can be adjusted according to different applications. In an embodiment, the initial voltage V1 may be the voltage level of the configuration channel pin CC1 or the signal pin PS in the power sourcing equipment 10 recorded at a specific time point during the debounce threshold period. In another embodiment, the initial voltage V1 may be the average of various voltage levels of the configuration channel pin CC1 or the signal pin PS in the power sourcing equipment 10 recorded at various time points during the debounce threshold period.

After turning on the switching device 120, the power sourcing equipment 10 may start to supply power to the powered device 20 via its power supply pin VBUS. In step 550, the current and failure judging circuit 160 is configured to measure the voltage $V_{CC1}$ of the configuration channel pin CC1 or the voltage $V_{DET}$ of the signal pin PS in the power sourcing equipment 10, and the current detecting circuit 170 is configured to monitor the value of the load current $I_{LOAD}$.

In step 560, the current and failure judging circuit 160 is configured to determine whether the load current $I_{LOAD}$ is smaller than the current threshold. For example, when the detecting voltage Vs is smaller than the reference voltage $V_{REF3}$, the comparator CP3 in the current and failure judging circuit 160 is configured to output the corresponding signal S3 to the control circuit 170, thereby informing that the detecting resistor Rs may encounter short circuit failure.

When the load current $I_{LOAD}$ flowing through the detecting resistor Rs is very small, it means that the powered device 20 is lightly-loaded, or that the detecting resistor Rs fails to provide over-current detection due to short circuit failure. Therefore, the present invention can determine which one of the above is the real cause in step 570.

For the current voltage V2 of the configuration channel pin or the signal pin PS of the power sourcing equipment 10 recorded in step 550, the current and failure judging circuit 160 is configured to determine whether the current voltage V2 is larger than the initial voltage V1 by the voltage threshold ΔV in the step 570. The current voltage V2 obtained in a loaded status (when the switching device 120 is turned on) may be larger than the initial voltage V1 obtained in a unloaded status (when the switching device 120 is turned off) due to losses caused by the transmission cable 30. The voltage threshold ΔV may thus be introduced to reflect the losses caused by the transmission cable 30.

When it is determined in step 560 that the load current $I_{LOAD}$ is smaller than the current threshold and it is determined in step 570 that the current voltage V2 is not larger than the initial voltage V1 by the voltage threshold ΔV, it indicates that the lightly-loaded powered device 20 is the cause of the very small load current $I_{LOAD}$ Under such circumstance, step 550 is executed again for continuously monitoring the status of the configuration channel pin CC1/CC2 or the signal pin PS in the power sourcing equipment 10.

When it is determined in step 560 that the load current $I_{LOAD}$ is smaller than the current threshold and it is determined in step 570 that the current voltage V2 is larger than the initial voltage V1 by the voltage threshold ΔV, it indicates that the detecting resistor Rs with short circuit failure is the cause of the very small load current $I_{LOAD}$. Under such circumstance, step 580 is executed for performing the single-fault protection procedure. For example, the switching device 120 may be turned off for cutting off the power supply path of the power sourcing equipment 10. This way, when the defected current detecting circuit 140 fails to provide over-current detection, the present invention can still prevent sudden inrush current from damaging other devices.

In an embodiment, step 560 may be executed prior to step 570. In another embodiment, step 570 may be executed prior to step 560. In yet another embodiment, steps 560 and 570 may be executed simultaneously. However, the order of executing steps 560 and 570 does not limit the scope of the present invention.

In the embodiment of the present invention, the negative input end of the comparator CP3 in the current and failure judging circuit 160 is coupled to the reference voltage $V_{REF3}$. The value of the reference voltage $V_{REF3}$ may be adjusted in different application for changing the criteria of performing over-current protection and the single-fault protection procedure.

In conclusion, the current detecting circuit in the present power delivery system can detect over-current occurrence in the powered device, thereby providing over-current protection. Meanwhile, the present invention can determine whether the current detecting circuit has encountered failure according to the status of the configuration channel pin or any signal pin and can provide single-fault protection when the current detecting circuit fails to provide over-current protection.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power delivery system which detects over-current and failure, comprising:
   a powered device;
   a transmission cable; and
   a power sourcing equipment, comprising:
     a first pin;
     a second pin;
     a third pin;
     a power conversion circuit configured to supply power to the powered device via the second pin;
     a switching device configured to selectively conduct or cut off a power supply path between the power conversion circuit and the second pin;
     an attach/detach identification circuit configured to determine whether the power sourcing equipment is electrically connected to the powered device via the transmission cable and output a corresponding first signal;
     a voltage acquisition circuit configured to:
       record an initial voltage of the third pin during a first period when the power sourcing equipment is electrically connected to the powered device but does not supply power to the powered device; and record a current voltage of the third pin during a second period when the power sourcing equipment is supplying power to the powered device via the second pin; and a current detecting circuit configured to monitor a value of a load current during the second period;

a current and failure determination circuit configured to:

determine whether the current voltage is larger than the initial voltage by a voltage threshold during the second period and output a corresponding second signal; and determine whether the load current is smaller than a current threshold during the second period and output a corresponding third signal; and a control circuit coupled to the attach/detach identification circuit and the current and failure determination circuit for receiving the first signal, the second signal and the third signal, and configured to:

turn off the switching device for cutting off the power supply path between the power conversion circuit and the second pin when determining that the current voltage is larger than the initial voltage by the voltage threshold according to the second signal and when determining that the load current is smaller than the current threshold according to the third signal.

2. The power delivery system of claim 1, wherein:
the control circuit is further configured to turn on the switching device for conducting the power supply path between the power conversion circuit and the second pin at a first time point when determining that the power sourcing equipment is electrically connected to the powered device at a second time point according to the first signal; and the first time point occurs later than the second time point by a debounce threshold period.

3. The power delivery system of claim 1, wherein the control circuit is further configured to:
Turn off the power conversion circuit when determining that the load current is not smaller than the current threshold according to the third signal.

4. The power delivery system of claim 1, wherein the first pin and the third pin are a same pin.

5. The power delivery system of claim 4, wherein the first pin is a configuration channel pin CC1 or a configuration channel pin CC2 according to a Universal Serial Bus (USB) Type-C specification, and the second pin is a power supply pin VBUS according to the USB Type-C specification.

6. The power delivery system of claim 1, wherein the first pin is a configuration channel pin CC1 or a configuration channel pin CC2 according to a USB Type-C specification, the second pin is a power supply pin VBUS according to the USB Type-C specification, and the third pin is a differential pin D+, a differential pin D−, a sideband use pin SBU1 or a sideband use pin SBU2 according to the USB Type-C specification.

7. The power delivery system of claim 1, wherein the voltage acquisition is further configured to:
record a plurality of voltage levels of the third pin at a plurality of time points during the first period; and
calculate an average value of the plurality of voltage levels and provide the calculated average value as the initial voltage.

8. A method of detecting over-current and failure in a power delivery system, comprising:
determining whether a power sourcing equipment in the power delivery system is electrically connected to a powered device in the power delivery system;

recording an initial voltage of a first pin in the power delivery system during a first period when the power sourcing equipment is electrically connected to the powered device but does not supply power to the powered device;

recording a current voltage of the first pin and monitoring a load current during a second period when the power sourcing equipment is supplying power to the powered device via a second pin; and the power sourcing equipment performing a single-fault protection procedure for stopping supplying power to the powered device when determining that the load current is smaller than a current threshold and that the current voltage is larger than the initial voltage by a voltage threshold.

9. The method of claim 8, further comprising:
turning on a switching device in the power delivery system for conducting a power supply path between a power conversion circuit in the power sourcing equipment and the second pin at a first time point when a third pin in the power delivery system detects a fourth pin in the powered device at a second time point, wherein the first time point occurs later than the second time point by a debounce threshold period.

10. The method of claim 9, further comprising:
performing the single-fault protection procedure by turning off the switching device for cutting off the power supply path between the power conversion circuit and the second pin when determining that the load current is smaller than the current threshold and that the current voltage is larger than the initial voltage by the voltage threshold.

11. The method of claim 9, further comprising:
turning off the power conversion circuit when determining that the load current is not smaller than the current threshold.

12. The method of claim 9, wherein the first pin and the third pin are a same pin.

13. The method of claim 12, wherein the first pin is a configuration channel pin CC1 or a configuration channel pin CC2 according to a USB Type-C specification, and the second pin is a power supply pin VBUS according to the USB Type-C specification.

14. The method of claim 9, wherein the first pin is a differential pin D+, a differential pin D−, a sideband use pin SBU1 or a sideband use pin SBU2 according to a USB Type-C specification, the second pin is a power supply pin VBUS according to the USB Type-C specification, and the third pin is a configuration channel pin CC1 or a configuration channel pin CC2 according to the USB Type-C specification.

15. The method of claim 8, further comprising:
recording a plurality of voltage levels of the first pin at a plurality of time points during the first period; and
calculating an average value of the plurality of voltage levels and providing the calculated average value as the initial voltage.

* * * * *